(12) United States Patent
Terai et al.

(10) Patent No.: US 8,679,727 B2
(45) Date of Patent: Mar. 25, 2014

(54) DEVELOPING METHOD FOR IMMERSION LITHOGRAPHY, SOLVENT USED FOR THE DEVELOPING METHOD AND ELECTRONIC DEVICE USING THE DEVELOPING METHOD

(75) Inventors: Mamoru Terai, Tokyo (JP); Takuya Hagiwara, Tokyo (JP); Takeo Ishibashi, Nagoya (JP); Miwako Ishibashi, legal representative, Nagoya (JP)

(73) Assignee: Renesas Electronics Corporation, Kanagawa (JP)

( * ) Notice: Subject to any disclaimer, the term of this patent is extended or adjusted under 35 U.S.C. 154(b) by 185 days.

(21) Appl. No.: 12/490,934

(22) Filed: Jun. 24, 2009

(65) Prior Publication Data

US 2010/0021703 A1 Jan. 28, 2010

(30) Foreign Application Priority Data

Jun. 25, 2008 (JP) .................................. 2008-166331
Sep. 18, 2008 (JP) .................................. 2008-239110

(51) Int. Cl.
G03F 7/00 (2006.01)
G03F 7/11 (2006.01)
G03F 7/20 (2006.01)
G03F 7/26 (2006.01)
G03F 7/32 (2006.01)

(52) U.S. Cl.
USPC ..................... 430/273.1; 430/270.1; 430/322; 430/331; 430/436

(58) Field of Classification Search
USPC ............................. 430/270.1, 273.1, 905, 331
See application file for complete search history.

(56) References Cited

U.S. PATENT DOCUMENTS 7,056,646 B1* 6/2006 Amblard et al. ............... 430/311
7,608,386 B2* 10/2009 Nozaki et al. ............... 430/271.1
7,662,543 B2* 2/2010 Kawamura et al. ........... 430/311

(Continued)

FOREIGN PATENT DOCUMENTS

JP 2007-148167 A 6/2007
JP 2007-219152 A 8/2007

(Continued)

OTHER PUBLICATIONS

K. Tanaka et al., "Surface Segregation in Polymer Mixtures," Kinou Zairyou.(Functional Material), CMC Publishing, May 2003, vol. 23, No. 5, pp. 19-27.

(Continued)

Primary Examiner — Amanda C. Walke
(74) Attorney, Agent, or Firm — McDermott Will & Emery LLP

(57) ABSTRACT

A developing method for immersion lithography is provided, realizing a process that is simple and low-cost and enables high repellency sufficient to allow high-speed scanning. The developing method for immersion lithography improved by inexpensive material without introducing any new facility, a solution to be used in the developing method, and an electronic device formed by using the developing method are provided. The developing method for immersion lithography is a method of developing for immersion lithography of an electronic device with a resist containing a surface segregation agent and chemically-amplified resist, including the step of development with alkali immersion, characterized by the dissolving and removing step, conducted using a dissolving and removing solution that selectively dissolves and removes the surface segregation agent of the resist.

8 Claims, 10 Drawing Sheets

(56) References Cited

U.S. PATENT DOCUMENTS

| | | | |
|---|---|---|---|
| 7,871,759 B2* | 1/2011 | Endo et al. | 430/311 |
| 2006/0008746 A1* | 1/2006 | Onishi et al. | 430/322 |
| 2007/0134593 A1* | 6/2007 | Hirayama et al. | 430/270.1 |
| 2008/0070167 A1* | 3/2008 | Takahashi et al. | 430/330 |
| 2008/0118861 A1* | 5/2008 | Kosugi et al. | 430/270.1 |
| 2008/0299502 A1* | 12/2008 | Shin et al. | 430/324 |
| 2009/0042147 A1* | 2/2009 | Tsubaki | 430/326 |
| 2009/0142715 A1* | 6/2009 | Araki et al. | 430/326 |
| 2009/0197199 A1* | 8/2009 | Ishizuka et al. | 430/273.1 |
| 2009/0239176 A1* | 9/2009 | Kanda | 430/285.1 |
| 2009/0280431 A1* | 11/2009 | Hirano et al. | 430/270.1 |
| 2010/0009132 A1* | 1/2010 | Cheng et al. | 428/195.1 |
| 2010/0124720 A1* | 5/2010 | Ishiduka et al. | 430/271.1 |
| 2010/0151395 A1* | 6/2010 | Ishiduka et al. | 430/325 |
| 2010/0183977 A1* | 7/2010 | Wang et al. | 430/270.1 |
| 2010/0248145 A1* | 9/2010 | Huang et al. | 430/286.1 |
| 2011/0053097 A1* | 3/2011 | Ishiduka | 430/325 |
| 2011/0065053 A1* | 3/2011 | Yoshida et al. | 430/325 |

FOREIGN PATENT DOCUMENTS

| | | |
|---|---|---|
| JP | 2007-241270 | 9/2007 |
| JP | 2008-032758 A | 2/2008 |
| JP | 2008-102276 A | 5/2008 |

OTHER PUBLICATIONS

Chinese Office Action, and English translation thereof, issued in Chinese Patent Application No. 200910150481.3 dated Mar. 31, 2012.

Office Action issued in Japanese Patent Application No. 2008-239110 dated Feb. 26, 2013.

* cited by examiner (a)

(b)

DEVELOPING METHOD FOR IMMERSION LITHOGRAPHY, SOLVENT USED FOR THE DEVELOPING METHOD AND ELECTRONIC DEVICE USING THE DEVELOPING METHOD

BACKGROUND OF THE INVENTION

1. Field of the Invention

The present invention relates to a developing method of a resist pattern using immersion lithography, solution used for the developing method, and to an electronic device formed using the developing method.

2. Description of the Background Art

In immersion exposure (immersion lithography), a water film (meniscus) is formed utilizing surface tension of water in a small space between a lens of an exposure apparatus and a wafer as an object of processing, to attain higher refraction index between the lens and a surface to be irradiated (surface of the uppermost film on the wafer). Effective numerical aperture (NA) of the lens can be increased to be higher than in common dry exposure, to approximately 1.44, that is, the refraction index of water. Therefore, immersion lithography has been put into industrial practice as a technique that increases resolution limit of lithography and enables miniaturization of patterns formed.

FIG. 1 is a schematic illustration of immersion lithography. As shown in FIG. 1, in immersion lithography, water 5 is provided as a meniscus 5a in a small space between a lens 3 and a photoresist layer 2 formed on the uppermost surface of a wafer 1 placed on a stage 6, and wafer 1 is scanned (as represented by an arrow A in FIG. 1) while it is irradiated with light through meniscus 5a, to realize scanning exposure.

As described above, in immersion lithography, there is water 5 forming the water film between lens 3 and photoresist layer 2 as the surface to be irradiated (the surface of uppermost film on wafer 1) and, therefore, when a common chemically-amplified resist for dry exposure is used, it is possible that low molecular compound such as photo-acid-generating agent or base contained in the chemically-amplified resist dissolves to water 5, possibly causing contamination of exposure apparatus including lens 3. If the resist has low repellency, micro water drops possibly remain on photoresist layer 2 after meniscus 5a has been moved when the water film (meniscus 5a) is moved on wafer 1, so that the resist is kept locally in contact with water for a long time. This may lead to pattern defects.

In order to prevent low molecular compound such as photo-acid-generating agent or base in chemically-amplified resist from being dissolved to water 5 and to enable high-speed and smooth movement of meniscus without leaving droplets, a technique has been adopted, which makes it difficult for the low molecular compound to dissolve from the surface of photoresist layer 2 and provides repellency to the surface.

A specific example of such technique involves formation of an upper layer protective film (top-coat) that dissolves to a developer on the resist, to prevent direct contact between the water and the resist. Further, a top-coatless resist has been developed and commercially available, in which a small amount of polymers (mainly, fluorine-containing polymer) having low critical surface energy, such as water repellent agent, is mixed in the chemically-amplified resist, to have the water repellent agent concentrated (unevenly distributed) only to the resist surface utilizing surface segregation effect of water repellent agent when coating film is formed, so that the two layers of resist and top-coat are spontaneously formed as a single coating film.

The method of providing a top-coat is generally referred to as top-coat process, which proceeds through the process flow shown in FIG. 2(a). According to this method, a resist layer is formed as a two-layered film by two steps of application, in which a common photoresist film (ST2-a3) is formed and a resist upper layer protection film (top-coat) is applied thereon (ST2-a4). It is often the case that the top-coat is formed of fluorine-containing polymer with alkali-soluble part, to have a highly repellent film that is soluble to alkali developer and automatically peeled at the time of development (see, for example, Japanese Patent Laying-Open No. 2007-148167). The top-coat process, however, is disadvantageously redundant as it requires two steps of application (ST2-a3 and ST2-a4) for forming the resist layer and it leads to higher cost, as two different chemicals are used for forming the resist and the top-coat. Further, there is a trade-off between the resist containing developer-soluble base and having high repellency. Therefore, repellency is not always sufficient for exposure to attain high throughput by scanning at higher speed.

On the other hand, there is a method using a top-coatless resist, which proceeds through the process shown in FIG. 2(b) and includes the process as illustrated in FIG. 7. According to this method, a small amount of polymers (fluorine-containing polymer or the like) having low critical surface energy, such as water repellent agent mentioned above, is mixed with resist liquid as described above, and the resist layer is formed thereby (see, for example, Japanese Patent Laying-Open No. 2008-102276). The water repellent agent is concentrated (unevenly distributed) only to the resist surface because of the surface segregation effect of water repellent agent, whereby a surface that corresponds to the top-coat can spontaneously be formed by a single step of forming a coating (ST2-b2). Such top-coatless resists have been developed and come to be commercially available. The surface segregation phenomenon described above is exhibited based on a principle of thermodynamics that minimizes the entire free energy (sum of mixture free energy, surface free energy, interfacial free energy and the like) of the single coating system (resist layer). Therefore, with such a material, process redundancy of forming the photoresist film and the top-coat through different steps of application (ST2-a3 and ST2-a4) in the top-coat process described above can be avoided and, as a result, increase in cost of apparatuses including application cups for separate processes and bake plates as well as increase in material cost can be prevented.

Here, there are mainly three types of water repellent agents: (1) material that is soluble to developer, similar to the top-coat material; (2) water repellent agent not at all soluble to alkali; and (3) water repellent agent having property similar to chemically-amplified resist, which is de-protected by catalytic function of acid generated during exposure, and exposed portions of which become soluble to alkali developer at the subsequent post exposure bake (PEB).

The water repellent agent that changes to be soluble to alkali developer tends to have lower segregation characteristic when applied, and similar to the top-coat having the above-described problem, it often fails to attain sufficient repellency. As can be seen from schematic illustrations of various pattern defects of FIGS. 8(a) to 8(c), when a water repellent agent not having alkali solubility at all is used, the water repellent agent may be left as insoluble matter at the time of development, resulting in residue 10b (FIG. 8(a)), inducing a micro-bridge 10c (FIG. 8(b)) even when there is only a few residue, or leaving granular residue 10d (Blob) (FIG. 8(c)) since excessively high repellency hinders cleaning during rinsing with pure water after immersion in alkali liquid in the developing process.

When a water repellent agent that is de-protected by acid and only the exposed portion of which changes to be soluble to alkali developer in post exposure bake (PEB) is used, defect generation is still possible at the unexposed portion, as in the water repellent agent not at all having alkali solubility described above. Specifically, in forming an electronic device, background portions are unexposed at the hole forming step using a positive resist or at the trench forming step for Cu wiring using a dark field mask and, therefore, there is a high risk of defect generation.

SUMMARY OF THE INVENTION

In the conventional immersion lithography process, in order to maintain performance of chemically-amplified resist while realizing immersion exposure, the process using top-coat has been widely adopted. The process, however, has the problems of higher material cost and difficulty of attaining repellency sufficient for high-speed scanning, as described above. The process using top-coatless resist to reduce cost of immersion lithography process and to reduce defects in resist pattern has a problem similar to the top-coat process (repellency for high-speed scanning) when alkali-soluble water repellent agent is used, and has a problem of pattern defects caused by insolubility to developer when water repellent agent not having alkali solubility or agent of which polarity changes by exposure is used.

In regard to pattern defects, there are problems that defects caused by immersion increases when resist surface layer at unexposed portions maintain high water repellency or added water repellent agent is reattached to the resist pattern. Such problems markedly increase when a hole pattern, which leaves much surface layer of resist, is formed.

The present invention was made in view of the foregoing, and its object is to provide a developing method for immersion lithography to obtain electronic device free of development defects, realizing a process that is simple and low-cost and enables high repellency sufficient to allow high-speed scanning, using a resist containing surface segregation agent. It is an object of the present invention to provide a developing method for immersion lithography improved by inexpensive material without introducing any new facility, a solution to be used in the developing method and an electronic device formed by using the developing method.

The present invention provides a developing method for immersion lithography of an electronic device with a resist containing a surface segregation agent and chemically-amplified resist, including the step of development with alkali immersion, characterized by a step of dissolving and removing, conducted using a dissolving and removing solution that selectively dissolves and removes the surface segregation agent of the resist.

Preferably, the step of dissolving and removing is performed before the step of development, and conducted through rinsing or immersion.

Further, the step of dissolving and removing may be performed simultaneously with the step of development. The step of dissolving and removing may be performed after the step of development.

In the present invention, preferably, the step of development and the step of dissolving and removing are performed using a same cup.

Further, preferably, the dissolving and removing solution at the step of dissolving and removing contains at least one of alcohol having carbon number of 4 or larger and alkyl ether having carbon number of 5 or larger. It is also preferable that the dissolving and removing solution at the step of dissolving and removing contains fluorine-containing solvent.

Preferably, the dissolving and removing solution at the step of dissolving and removing contains alcohol having carbon number of 4 or larger and alkyl ether having carbon number of 5 or larger. Further, it is preferred that the solution consists of fluorine-containing solvent.

Further, in the present invention, preferably, the dissolving and removing solution at the step of dissolving and removing contains water.

The present invention relates to an electronic device manufactured using the developing method for immersion lithography described above.

Further, the present invention relates to a dissolving and removing solution used in the developing method for immersion lithography described above, the solution selectively dissolving and removing a surface segregation agent forming a resist. Preferably, the solution contains alcohol having carbon number of 4 or larger or alkyl ether having carbon number of 5 or larger, or contains fluorine-containing solvent. Further, in the present invention, the dissolving and removing solution contains water.

According to the present invention, it is possible to realize a process for manufacturing electronic devices including a developing method for immersion lithography attaining high throughput and low defects, through simple and inexpensive process steps and apparatus arrangement that involve neither conventional top-coat application step nor top-coat peeling step using a special apparatus.

Further, the developing method for immersion lithography in accordance with the present invention is usable not only in a top-coatless resist process but also in a process using a top-coat.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
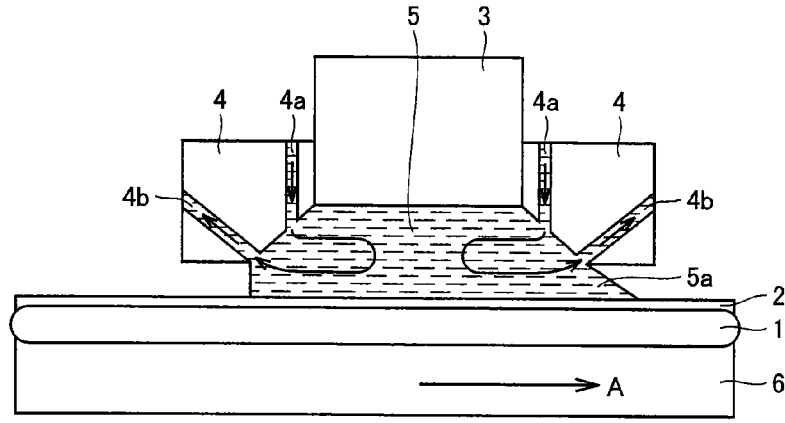
FIG. 1 is a schematic illustration representing immersion lithography.
Figure 2:
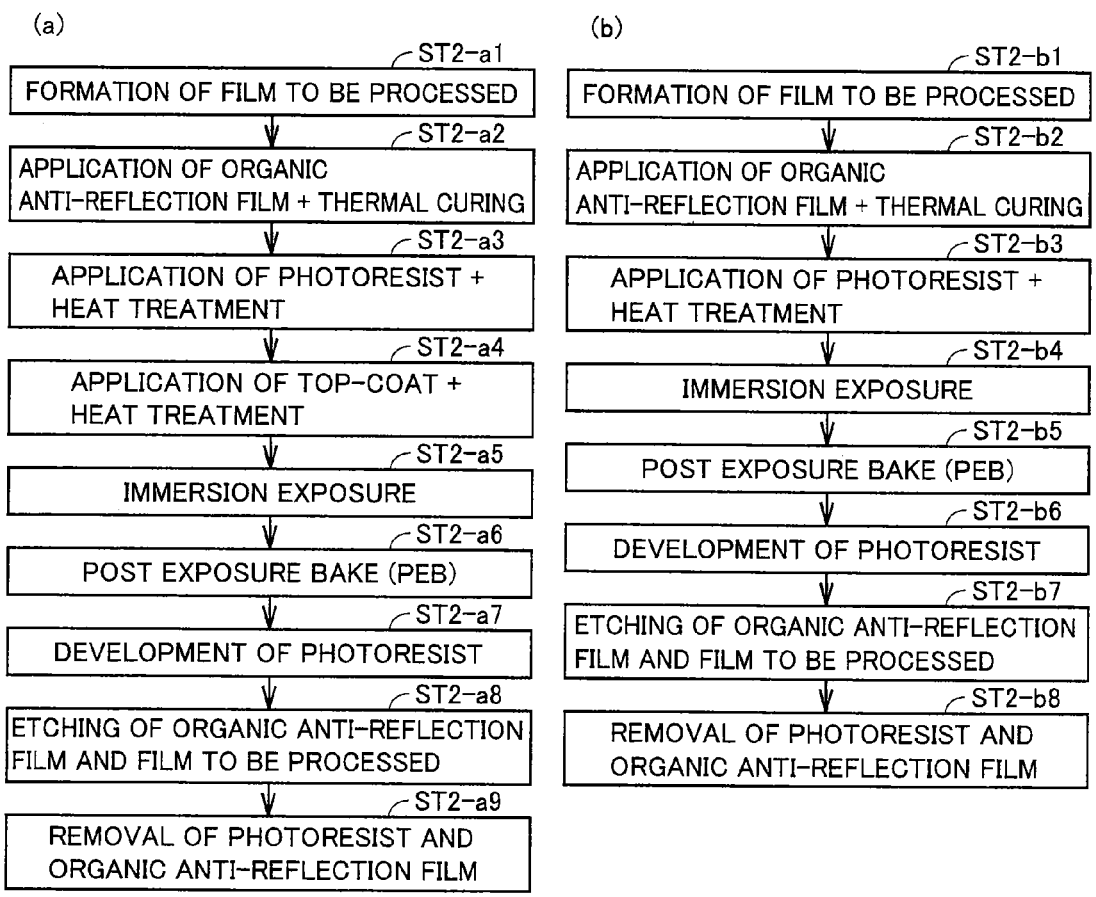
FIG. 2 includes (a) a process flow for the top-coat process and (b) a process flow of a method using top-coatless resist.

In the following, the present invention will be described in greater detail. The description of embodiments below refers to figures, in which portions denoted by same reference characters represent the same or corresponding portions.

<Developing Method>

The present invention is directed to a developing method for immersion lithography of an electronic device including a step of development with alkali immersion, characterized in that the method includes a step of dissolving and removing, conducted using a dissolving and removing solution that selectively dissolves and removes surface segregation agent of a resist containing the surface segregation agent and chemically-amplified resist. In the present invention, the resist means a so-called top-coatless resist, including a component of surface segregation agent and chemically-amplified resist.

In a conventional process using a top-coat, it is possible to use a material having low solubility to alkali developer for the top-coat, in order to improve water repellency of the top-coat. Then, as in the case of surface segregation agent (for example, water repellent agent) contained in the top-coatless resist, solubility of top-coat to the developer possibly becomes insufficient, possibly resulting in pattern defects. The effect of the present invention can be attained also in the process using such a top-coat.

<Immersion Lithography>

FIG. 1 shows an outline of immersion lithography. As shown in FIG. 1, immersion lithography is a method in which water 5 is provided as a meniscus 5*a* in a small space between a lens 3 and a photoresist layer 2 formed on the uppermost surface of a wafer 1 placed on a stage 6, and wafer 1 is scanned (as represented by an arrow A in FIG. 1) while it is irradiated with light through meniscus 5*a*, to realize scanning exposure. Here, water 5 forming meniscus 5*a* is introduced from inlets 4*a* provided around lens 3 and sucked into an external device through suction openings 4*b*, whereby water 5 filling the space between lens 3 and photoresist layer 2 is replaced. FIG. 1 shows an example in which a top-coatless resist is used as photoresist layer 2.

In the present invention, the step of development with alkali immersion is not specifically limited, and any conventionally known process step may be used.

<Resist>

Figure 3:
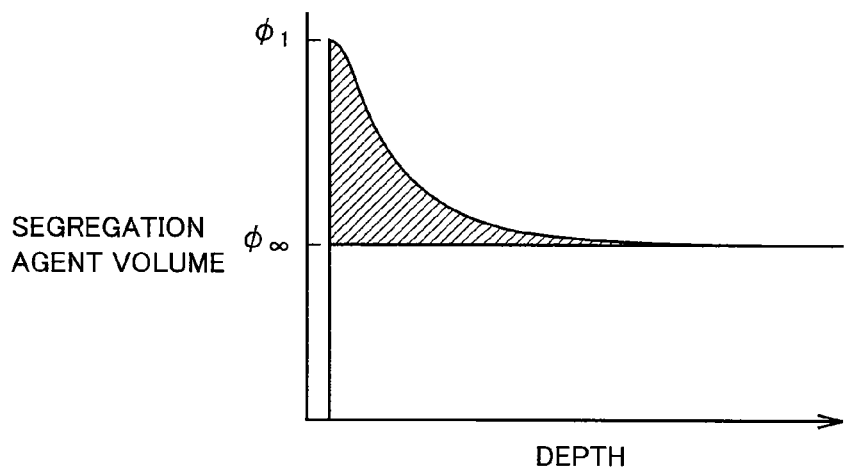
FIG. 3 is a graph showing a relation between resist depth and volume of segregation agent.

In the present invention, the resist contains at least a surface segregation agent (hereinafter also referred to as "segregation agent") and a component forming chemically-amplified resist (hereinafter also simply referred to as "resist component"). The surface segregation agent has such a characteristic that it segregates at the surface of resist, with its ratio of presence reduced exponentially in the depth direction as shown in the graph of FIG. 3 representing the relation between resist depth and volume of segregation agent. This is exhibited based on a principle of thermodynamics that minimizes the entire free energy (sum of mixture free energy, surface free energy, interfacial free energy and the like), and the state of segregation is known to be expressed by the following equation (1), where $\phi(z)$ represents volume fraction of surface segregation agent at a depth z from resist surface:

$$\phi(z)=\phi_\infty+(\phi_\delta-\phi_\infty)\exp(-z/\xi) \quad (1)$$

(in Equation (1), $\phi_\delta$ and $\phi_\infty$ are volume fractions of surface segregation agent at the top surface and bulk of the resist, respectively, and $\xi$ represents attenuation length of the surface segregation agent with respect to surface enrichment) (KINOU ZAIRYOU (Functional Material), CMC Publishing, May 2003, Vol. 23, No. 5).

Figure 4:
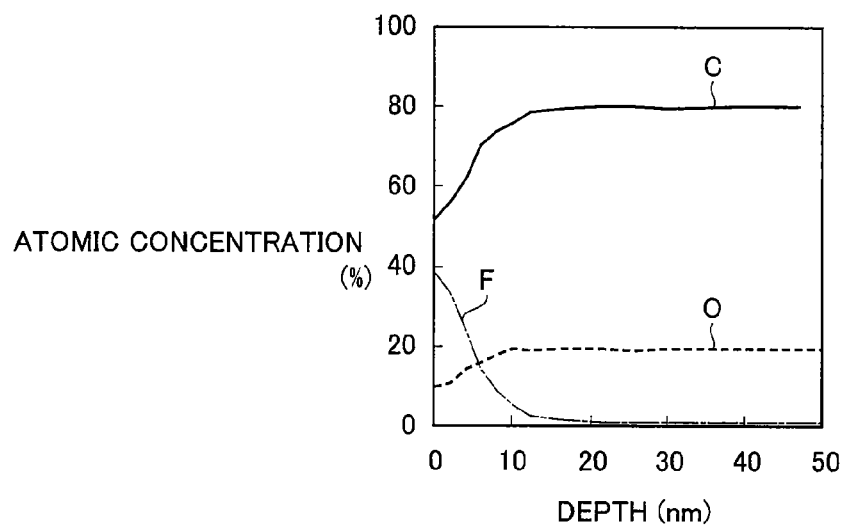
FIG. 4 is a graph showing a relation between resist depth and atomic concentrations of resist and surface segregation agent.

FIG. 4 schematically shows the state of segregation of surface segregation agent with respect to atomic concentration. In FIG. 4, atomic concentrations of carbon (C), oxygen (O) and fluorine (F) in the resist component and repellent agent as the surface segregation agent, are plotted. Carbon and oxygen are mainly resist components, and fluorine is a component of surface segregation agent. As can be seen from FIG. 4, as the depth from the resist surface increases, the component of surface segregation agent reduces exponentially as in FIG. 3, while the resist component comes to have higher atomic concentration as the depth increases.

Figure 5:
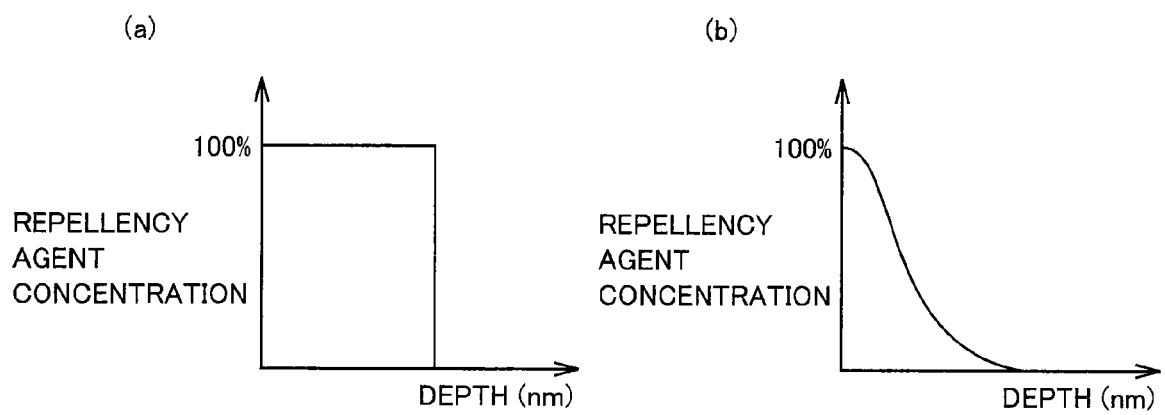
FIG. 5 includes (a) a schematic illustration showing the ratio between resist depth and repellent agent concentration when top-coat is provided and (b) a schematic illustration showing the ratio between resist depth and repellent agent concentration when top-coatless resist is used.

Here, if a top-coat is provided as in the conventional example and water repellent agent is used as an example of the surface segregation agent, the concentration of water repellent agent (atomic ratio) is always 100% in the depth direction of photoresist layer, as shown in FIG. 5(*a*). If a top-coatless resist is used, the concentration of water repellent agent (atomic ratio) reduces exponentially as shown in FIG. 4 and FIG. 5(*b*). Referring to FIG. 5(*b*), at the depth of 0 nm, that is, at the resist surface, the water repellent agent concentration is not always 100% and it may, for example, be 70%. In film density analysis by X-ray reflectivity technique, a two-layered structure of different film densities in the depth direction was observed in the example of FIG. 5(*a*), while film density in the depth direction was uniform regardless of segregation agent concentration in the example of FIG. 5(*b*). Specifically, top-coat of FIG. 5(*a*) is formed of a two-layered film (resist film and top-coat), and the film of FIG. 5(*b*) is a single application layer (single layered film of top-coatless resist).

The present invention includes the step of dissolving and removing the surface segregation agent in a top-coatless resist in which the surface segregation agent is segregated as described above, whereby immersion lithography attaining high throughput and low defects is realized without adding any further process or apparatus.

As the surface segregation agent described above, conventionally known polymers having small critical surface energy, used for such top-coatless resist, can be used. An example is a fluorine-containing resin component disclosed in Japanese Patent Laying-Open No. 2008-102276. Specifically, fluorine-containing polymer such as fluorine-containing resin component having a building block represented by a general expression: —(CH$_2$—C(COOY$^o$R$^f$)— may be used. In the general expression, R represents hydrogen atom, lower alkyl group, halogen atom or lower alkyl halide group, Y$^o$ represents alkylene group, and R$^f$ represents fluorinated alkyl group. Content of such surface segregation agent in the resist is not specifically limited and may be adjusted appropriately.

The chemically-amplified resist used in the present invention is not specifically limited, and any conventionally known resist fit for the purpose may be selected and used. In the chemically-amplified resist, acid is generated in the resist film by photoreaction, and in post exposure bake, using the acid as a catalyst, base resin of resist reacts and forms a pattern. Even if the amount of acid generated during exposure is small, very high sensitivity can be attained, as the reaction proceeds in a chained manner because of thermal diffusion.

<Step of Dissolving and Removing>

The step of dissolving and removing of the present invention is executed using a dissolving and removing solution that selectively dissolves and removes the surface segregation agent, of the resist containing surface segregation agent and chemically-amplified resist. Because of this step, the present invention realizes immersion lithography with high throughput and low defects, without adding any further process or apparatus.

Figure 6:
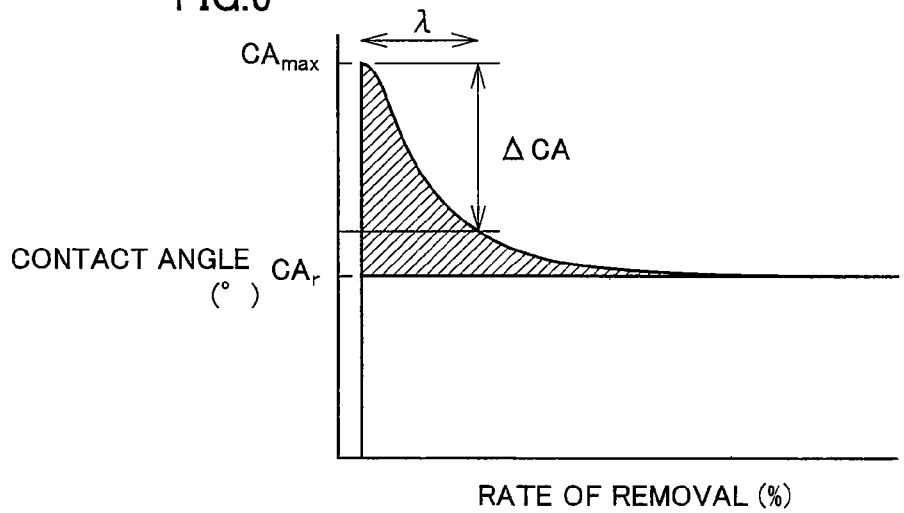
FIG. 6 is a graph showing a relation between ratio of removal of surface segregation agent and contact angle at a resist surface.
Figure 7:
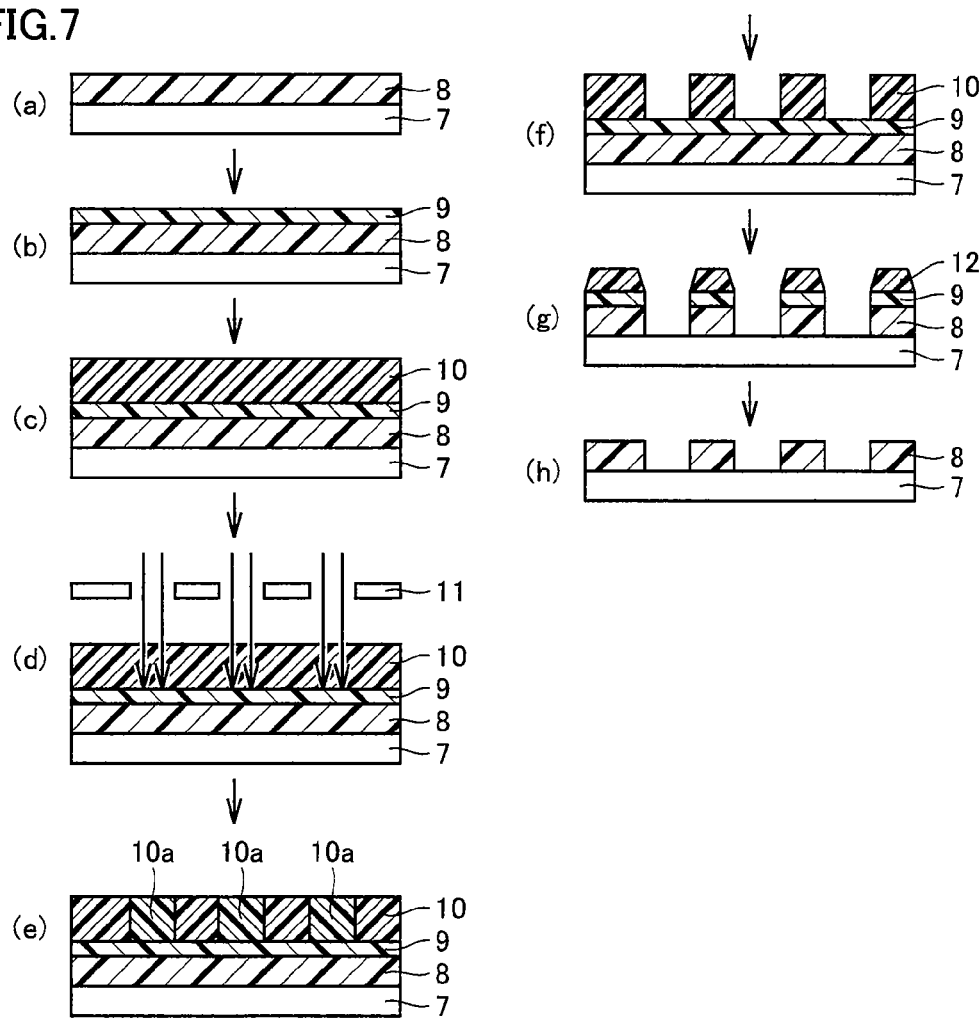
FIG. 7 includes schematic illustrations (a) to (h) representing various steps of a flow for top-coatless resist.
Figure 8:
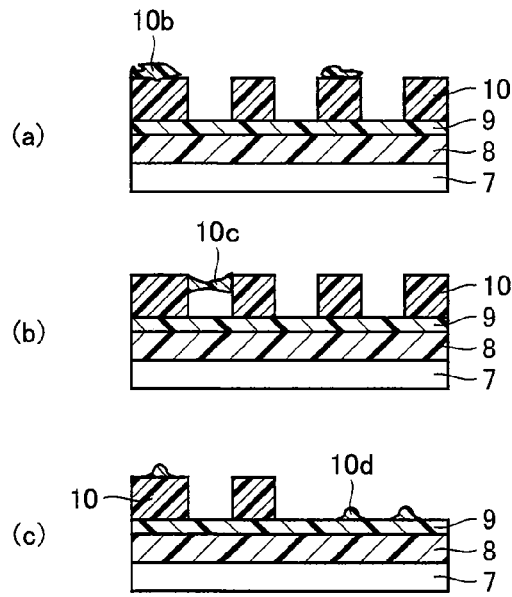
FIG. 8 includes schematic illustrations showing (a) defects caused by residue, (b) a defect caused by micro-bridge, and (c) defects caused by granular residue.

In the step of dissolving and removing mentioned above, it is not necessary to remove entire surface segregation agent contained in the resist as in the conventional step of providing a top-coat. Some surface segregation agent in an amount not affecting subsequent process steps may be left, as the effect of the invention can be exhibited if the surface segregation agent is removed and water repellency is reduced sufficiently to reduce resist pattern defects caused by the water repellency of the resist surface. Specifically, when the ratio of dissolving and removal of surface segregation agent is determined based on water repellency of the processed surface, acceptable ratio of removal ($\Delta CA/CA_r \times 100(\%)$) of the repellent agent may be 80% or higher, where contact angle of resist surface before the step of dissolving and removing is represented as CA$_{max}$ (CA$_r$) and decrease of contact angle when surface segregation agent of λnm is dissolved and removed from the surface is represented as ΔCA, as can be seen from the relation between the ratio of removal of surface segregation agent and the contact angle of resist surface shown in FIG. 6. The ratio of removal is preferably 90% or higher, and desirably, 100%. The degree of dissolving and removing surface segregation agent (amount of removal) can be adjusted by selecting types and compositions of solvent serving as the dissolving and removing solution and by varying process time, as will be described later. As long as the above-described effect of the invention of decreasing water repellency is attained, removal of only a part of base resin forming the resist or photoacid generating agent included in the resist film using the dissolving and removing solution in the process of dissolving and removing surface segregation agent is also encompassed by the scope of the invention.

In a first approach of the step of dissolving and removing, dissolving and removal are done prior to the step of development with alkali immersion. Specifically, using a dissolving and removing solution that selectively dissolves and removes the surface segregation agent in the resist, the surface segregation agent that has low solubility to alkali used at the development process is selectively removed, and then ordinary developing process including development step of alkali immersion and rinsing step with pure water is executed. According to the first approach, the substance having low solubility to developer (surface segregation agent and the like) can be removed with a solvent beforehand, and, therefore, reattachment of the substance having low solubility to developer to the resist pattern, which possibly occurs in the subsequent step of alkali immersion or rinsing with pure water in the ordinary (conventional) method can be avoided. Further, as the contact angle of resist surface with respect to processing solutions used at the step of alkali immersion and rinsing with pure water is decreased, performance of cleaning the resist surface can be improved. The first approach is particularly suitable if the used surface segregation agent is insoluble to developer.

A second approach of the step of dissolving and removing is also possible, in which the dissolving and removing solution is added to alkali used in the step, so that the developing step and the step of dissolving and removing are carried out simultaneously. When the step of developing and the step of dissolving and removing are carried out simultaneously, the process can be simplified and the process time can be reduced, in addition to the advantages attained by the first approach described above. Further, a third approach is also possible, in which the step of dissolving and removing is performed after the ordinary step of development with alkali immersion described above. According to this approach, hardly soluble substance that still remains at the end of the developing step can be removed, in addition to the advantages attained by the first approach described above. Another advantage is that the dissolving and removing agent does not negatively affect the resist that has been de-protected and become alkali-soluble. The third approach is particularly suitable if the surface segregation agent used is of the type similar to the chemically-amplified resist, which is de-protected by the catalytic function of acid generated by exposure and exposed portion of which changes to be soluble to alkali developer in the subsequent step of post exposure bake (PEB).

The present invention may include the step of dissolving and removing of at least one of the first to third approaches. It is also possible to combine two or more of the first to third approaches. Specifically, in a single development process, the first and second approaches may be combined, the first and third approaches may be combined, the second and third approaches may be combined, or the first, second and third approaches may be combined.

By performing at least one of the first to third approaches, immersion lithography with high throughput and few defects becomes possible.

Figure 15:
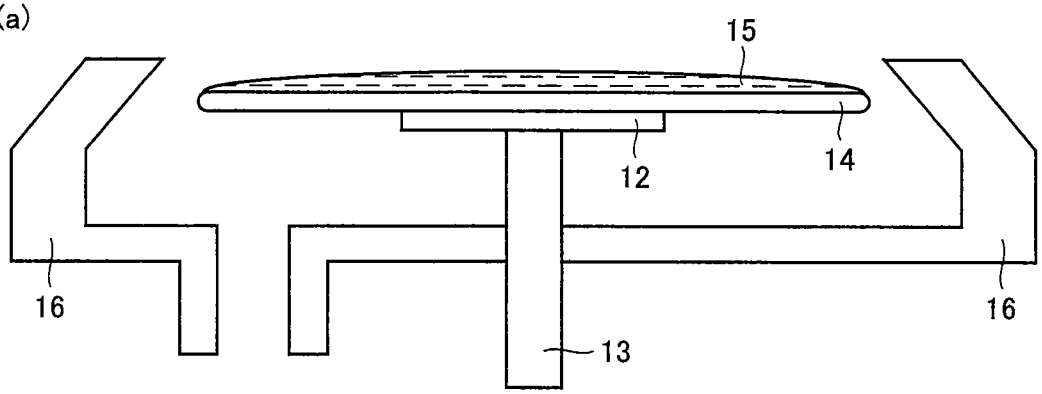
FIG. 15 includes schematic illustrations showing (*a*) immersion process and (*b*) rinsing process.
Figure 15:
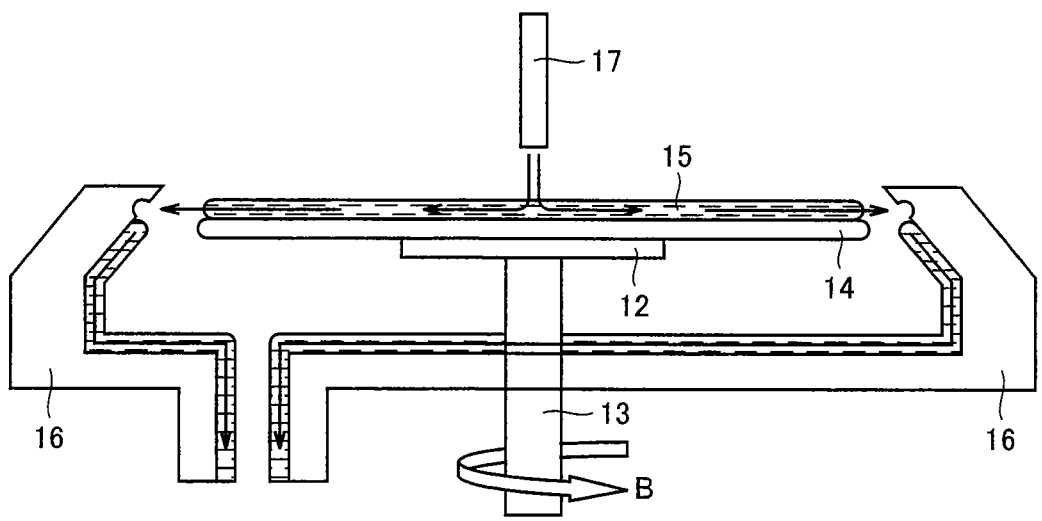

In any of the first, second and third approaches described above, dissolving and removing can be attained by immersing the resist in the dissolving and removing solution (see FIG. 15(a)) or by rinsing process (see FIG. 15(b)). FIG. 15(a) is a schematic illustration showing the immersion process, in which a wafer 14 having a film to be processed, a top-coatless resist and the like is placed on a stage 12 provided in a common development cup 15, and covered with immersion liquid 15 (puddle). At this time, rotation shaft 13 is kept stationary. FIG. 15(b) is a schematic illustration showing the rinsing process in which, as in FIG. 15(a), a wafer 14 having a film to be processed, a top-coatless resist and the like is placed on a stage 12 provided in a common development cup 15, and rotated in a direction B of FIG. 15(b) by rotation shaft 13, while immersion liquid 15 is supplied to the surface of wafer 14 from above through a nozzle 17. Here, the development cup functions as a wall that serves to prevent scattering of liquid spun out from the wafer at the step of known spin cleaning and thereby to recover and guide the liquid to a waste liquid drain. The immersion process or rinsing process can be conducted using the development cup of the developing apparatus used for conventional lithography. A nozzle for supplying the dissolving and removing liquid is attached to the development cup, as in the case of supplying alkali for development step or supplying pure water for rinsing using pure water or lower alcohol, and the wafer surface is rinsed using the dissolving and removing liquid supplied from the nozzle, or the wafer is immersed in the dissolving and removing liquid. What is necessary here is simply the attachment of a nozzle, and any other new process unit is unnecessary. Therefore, it is possible to perform the dissolving and removing process in a very simple manner to attain the effect of the present invention. In the present invention, pure water or water refers to ultra pure water (having specific resistance of 18.0 MΩ·cm or higher) commonly used in the process of manufacturing electronic devices, though the degree of purity is not limiting.

In the present invention, the step of development and the step of dissolving and removing described above can be performed using one same cup, by selecting the dissolving and removing solution. When the step of development and the step of dissolving and removing are performed using the same cup, simply by adding a nozzle, an apparatus used for the developing process for the conventional top-coat resist can advantageously be applied as it is.

<Dissolving and Removing Solution>

Typical examples of dissolving and removing solution that dissolves the surface segregation agent and not dissolving chemically-amplified resist component include a fluorine-based solvent that does not dissolve chemically-amplified resist component, a non-fluorine-based solvent that does not dissolve chemically-amplified resist component, and a solution containing mixture containing the above-mentioned solvents mixed at an appropriate ratio. In the present invention, when the dissolving and removing solution mentioned above consists only of a solvent, it may be referred to as the dissolving and removing solvent.

The fluorine-based solvent includes fluorine-modified aliphatic hydrocarbon-based solvent, fluorine-modified aromatic hydrocarbon-based solvent, fluorine-modified ether-based solvent and fluorine-modified alkylamine-based solvent. Specific examples are: polyfluorotrialkylamine compound (fluorine-modified alkylamine-based solvent) such as perfluorobenzene, pentafluorobenzene, 1,3-bis(trifluoromethyl)benzene, 1,4-bis(trifluoromethyl)benzene, perfluorotributylamine, perfluorotripropylamine and perfluorotripentylamine; fluorine-modified aliphatic hydrocarbon-based solvent such as perfluorodecalin, perfluorocyclohexane, perfluoro(1,3,5-trimethylcyclohexane), perfluoro(2-butyltetrahydrofuran), perfluorohexane, perfluorooctane, perfluorodecane, perfluorododecane, perfluoro(2,7-dimethyloctane), 1,1,2-trichloro-1,2,2-trifluoroethane, 1,1,1-trichloro-2,2,2-trifluoroethane, 1,3-dichloro-1,1,2,2,3-pentafluoropropane, 1,1,1,3-tetrachloro-2,2,3,3-tetrafluoropropane, 1,1,3,4-tetrachloro-1,2,2,3,4,4-hexafluorobutane, perfluoro(1,2-dimethylhexane), perfluoro(1,3-dimethylhexane), 2H,3H-perfluoropentane, 1H-perfluorohexane, 1H-perfluorooctane, 1H-perfluorodecane, 1H,1H,1H,2H,2H-perfluorohexane, 1H,1H,1H,2H,2H-perfluorooctane, 1H,1H,1H,2H,2H-perfluorodecane, 3H,4H-perfluoro-2-methylpentane, 2H,3H-perfluoro-2-methylpentane, 1H-1,1-dichloroperfluoropropane, 1H-1,3-dichloroperfluoropropane, and perfluoroheptane; fluorine-modified aromatic hydrocarbon-based solvent such as m-xylenetrifluoride, m-xylenehexafluoride and benzotrifluoride; and fluorine-modified ether-based solvent such as methylperfluorobutylether and perfluoro(2-butyltetrahydrofuran). One of these solvents may be used by itself, or two or more of these may be mixed for use.

As the non-fluorine-based solvent, alcohol-based solvent, ether-based solvent, hydrocarbon-based solvent and ketone-based solvent may be used. Specific examples include: alcohol-based solvent such as butanol (normal, iso, tertiary), methylethyl carbinol, pentyl alcohol, 3-pentyl alcohol, 2-pentyl alcohol, amyl alcohol, hexyl alcohol, heptyl alcohol, nonyl alcohol, octyl alcohol, pinacol, dimethylpropanol, 3-methyl-2-butanol, 2-methyl-2-butanol, cyclohexanol, ethylene glycol, and allyl alcohol; ether-based solvent such as diethyl ether, isobutyl methyl ether, and propylene glycol methyl-ether; hydrocarbon-based solvent such as petroleum benzine, mineral spirits, toluene and xylene; and ketone-based solvent such as acetone.

The dissolving and removing solutions mentioned above should preferably contain a solvent containing at least one of alcohol having carbon number of 4 or larger and alkyl ether having carbon number of 5 or larger, or a fluorine-containing solvent. It is preferred to use at least one of alcohol having carbon number of 4 or larger and alkyl ether having carbon number of 5 or larger as a solvent, and use of fluorine-containing solvent is preferred. If such a solvent is selected, dissolving and removal can be done with higher efficiency.

In the present invention, the dissolving and removing solution may contain water. In that case, it is preferred that the solution contains a component (solvent) that dissolves the surface segregation agent, in addition to water. This approach is advantageous in that safety of the dissolving and removing solution is improved, it is cost-efficient, the solution has high compatibility with alkali solution used for development, and waste liquid treatment is facilitated. If the solvent contains water, it is preferred that a component (solvent) that dissolves the surface segregation agent is contained as an assisting agent, of which example includes an organic solvent that is mixed with pure water. Specifically, alcohol having carbon number of 3 or smaller, a water-soluble surfactant or the like may be used. As the water-soluble surfactant, fluorine-based surfactant is preferred, of which example includes: Megafac series such as F114, F410, F493, F443, F472F, F470(R08) manufactured by DIC Corporation; and surflon (registered trademark) water soluble surfactant such as S-111n, S-113, S-121, S-131, S-132, S-141 and S-145 manufactured by AGC Seimi Chemical Co. Ltd.

Further, the dissolving and removing solvent used in the present invention should preferably be selected such that waste of dissolving and removing solvent and alkali developer can be disposed as mixed waste. If it is necessary to dispose such solvent and developer separately, separate disposal (waste) is also possible, by using a development cup having a known waste line of which opening/closing is controlled. In order to enable mixed disposal, a so-called dispersive substance such as appropriate short-chain alcohol or surfactant may be added to prevent phase separation of dissolving and removing solvent, alkali developer and pure water. Examples of the dispersive substance include: non-ionic fluorine-based surfactant such as megafac F-142D, F-144D, F-177, F-183 and F-184, anionic fluorine-based surfactant such as megafac F-110, F-116, F-120, F-191 and F-812, cationic fluorine-based surfactant such as megafac F-150 and F-824 and amphoteric fluorine-based surfactant such as megafac F-160, manufactured by DIC Corporation, and non-fluorine-based nonionic surfactant such as Amizol series, Amizett series and acetylenol series manufactured by Kawaken Fine Chemicals Co., Ltd.

As a solvent that prevents phase separation of the mixture, lower alcohol having carbon number of 3 or smaller such as propyl is suitably used. By way of example, di-isopentylether, which is an ether-based solvent, can be used as a top-coatless resist developer (alkali) without causing phase separation, when mixed with ethanol and TMAH solution at a ratio of 1:3:1. Further, $CF_3CH_2OCF_2CHF_2$, which is a fluorine-based solvent, can be used as a top-coatless resist developer (alkali) without causing phase separation, when mixed with ethanol, isobutanol and TMAH solution at a ratio of 1:3:2:2.

The developing method for immersion lithography of the present invention may include, other than the dissolving and removing step described above, various steps of development that have been conventionally known. One such step is the rinsing step with pure water, and the rinsing step may be performed either before or after, or both before and after the developing step. The developing method in accordance with the present invention may be used not only for the top-coatless resist process but also for the process using top-coat.

Further, the present invention relates to an electronic device obtained by the developing method for immersion lithography described above. As the method enables immersion lithography with high throughput and few defects, electronic devices having long life and high reliability can be provided. Examples of such electronic devices include semiconductor devices, liquid crystal display elements, magnetic heads and micro-lenses.

EXAMPLES

Though the present invention will be described in greater detail with reference to specific examples in the following, the present invention is not limited to such examples. In the following description, ultra-pure water is used as water or pure water unless otherwise specified.

Example 1

Figure 9:
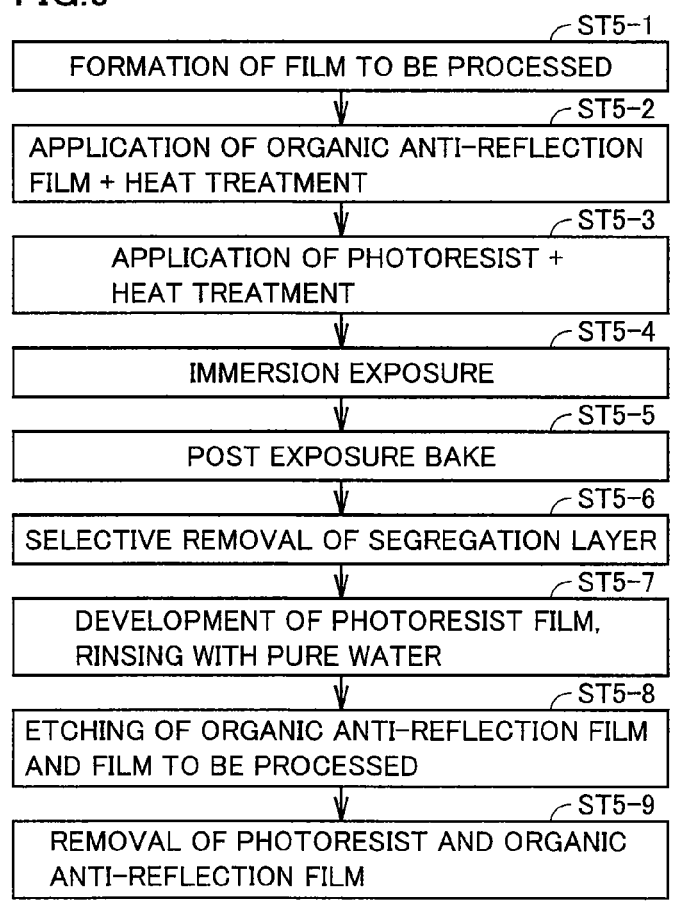
FIG. 9 is a process flow showing steps of manufacturing an electronic device, including the developing method for immersion lithography in accordance with Example 1.
Figure 10:
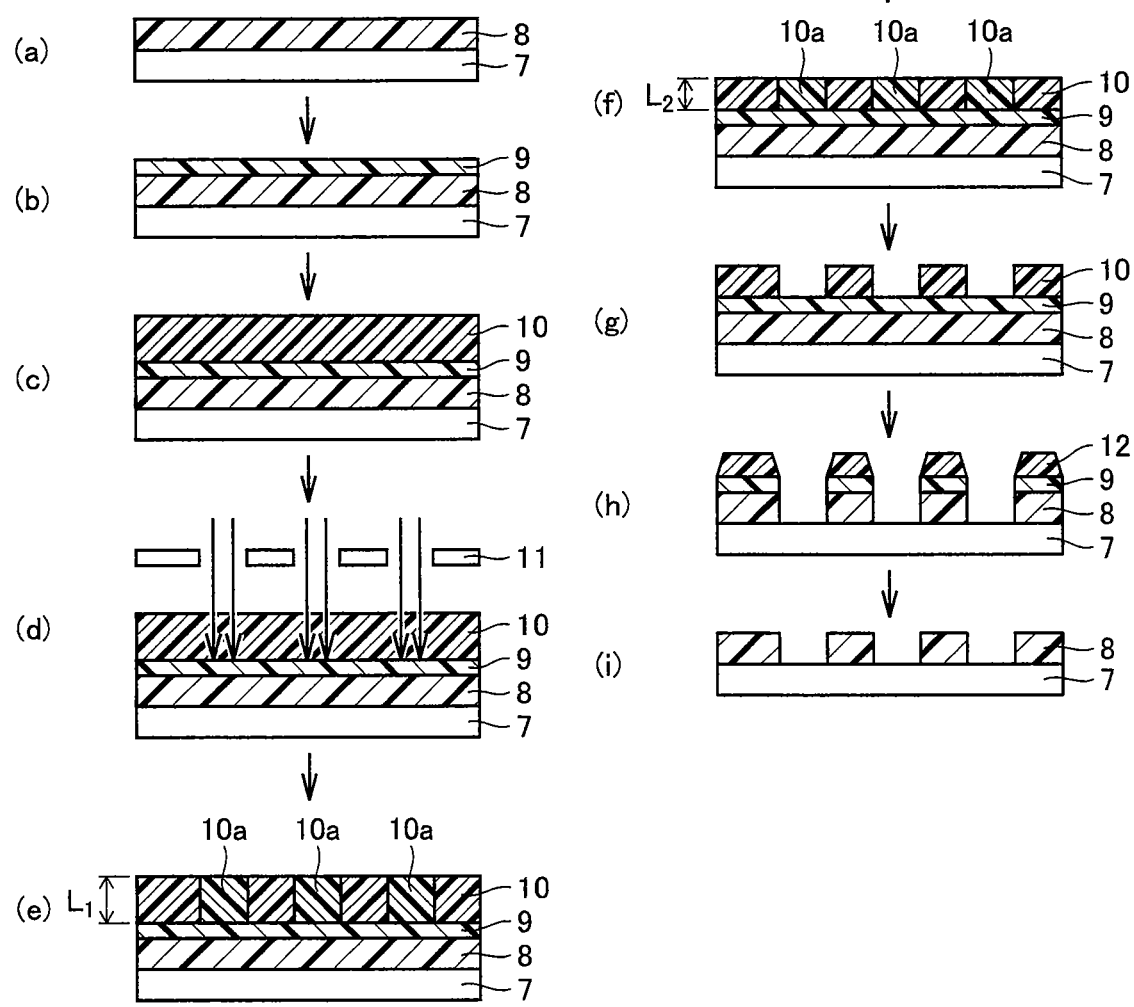
FIG. 10 includes schematic illustrations (*a*) to (*i*) representing various steps of manufacturing an electronic device, including the developing method for immersion lithography in accordance with Example 1.

FIG. 9 shows a process flow of steps for manufacturing an electronic device, including the development method for immersion lithography as Example 1, and FIG. 10 includes schematic illustrations of each of the steps. In Example 1, the step of dissolving and removing is performed before the step of development with alkali immersion.

As shown in FIG. 10(a), a film 8 to be processed was formed on a substrate 7 (ST5-1 of FIG. 9), an organic anti-reflection film 9 (film thickness: 78 nm) was applied on film 8 to be processed, and heat treatment (hereinafter also referred to as baking) was performed at 205° C. for 90 seconds (ST5-2 of FIG. 9, FIG. 10(b)). Thereafter, commercially available top-coatless resists A to C containing surface segregation agents (water repellent agents) having different characteristics listed in Table 1 were each applied by spin-coating under conditions shown in Table 1, and thereafter baked to form photoresist film 10 (ST5-3 of FIG. 9 and FIG. 10(c)). Typically, photoresist film 10 has a thickness of 100 to 200 nm.

Thereafter, substrate 7 is exposed using an immersion exposure apparatus through a mask 11 (ST5-4 of FIG. 9), and post exposure bake was conducted under the conditions shown in Table 1 (ST5-5 of FIG. 9, FIGS. 10(d) and 10(e)). Photoresist film 10a exposed as shown in FIG. 10(e) formed a desired pattern. Thereafter, on substrate 7, dissolving and removing solvents (solvents 1 to 7) shown in Table 2 were deposited (puddle) (see FIG. 15(a)), whereby the surface segregation agents existing at the upper layer portion of photoresist film 10 were selectively dissolved and removed, without dissolving chemically-amplified resist component as the main component of photoresist film 10 (ST5-6 of FIG. 9, FIG. 10(f)). Referring to FIGS. 10(e) and 10(f), by way of example, if the surface segregation agent has volume ratio of 70% at the uppermost surface of the resist, thicknesses $L_1$ and $L_2$ of photoresist film 10 may be unchanged before and after the step of dissolving and removing surface segregation agent. Namely, $L_2 \leq L_1$. Thereafter, using the same developing cup as used for the dissolving and removing step, photoresist film 10 was developed with 2.38% solution of tetramethyl ammonium hydroxide (also denoted as TMAH), and then rinsed with pure water (ST5-7 of FIG. 9, FIG. 10(g)), and thus, resist pattern formation was completed.

Using the resist pattern as a mask, film 8 to be processed was dry-etched. The film 8 to be processed is polysilicon at a step of transistor formation after completion of element separating step, well forming step and ion injection for channel doping. Plasma dry etching was conducted on film 8 to be processed as such and organic anti-reflection film 9 (ST5-8 of FIG. 9, FIG. 10(h)). Photoresist film 10 and organic anti-reflection film 9 were removed (ST5-9 of FIG. 9, FIG. 10(i)) after completion of plasma dry etching mentioned above, through $O_2$ plasma ashing, or common wet process using sulfuric acid and hydrogen peroxide solution.

Using substrate 7 processed as described above, a wafer forming process for electronic devices was performed in the following manner.

As an interlayer film at a contact step, a TEOS silicon oxide film was formed by CVD. Using the TEOS silicon oxide film as a film to be processed, a resist mask for a contact hole pattern was formed by immersion lithography including the development step using the dissolving and removing solvent described above. Thereafter, a hole was opened by dry etching in the TEOS silicon oxide film as the film to be processed, and then the resist mask was removed. A thin barrier metal was formed in the hole, and a tungsten film was formed thereon by CVD. Thereafter, CMP etch-back was conducted, whereby the contact hole was plugged with tungsten.

Next, in order to form a single damascene structure as a step of forming first metal interconnection, an interlayer insulating film having low dielectric constant (low-K film) was formed, and the interlayer insulating film having low dielectric constant (low-K film) as a film to be processed was subjected to lithography, etching and resist removal in accordance with the conventional method, so that a trench interconnection pattern was formed. A barrier metal was formed in the trench, Cu was filled by plating, and CMP etch-back was conducted, whereby the first metal interconnection was formed.

Further, in order to form a dual damascene structure as a step of forming second metal interconnection, a liner film and an interlayer insulating film having low dielectric constant (low-K film) were formed, and through lithography, etching and resist removal of the hole and trench, the second metal interconnection was formed. These steps were repeated a number of times while stacking layers, and the process for forming the wafer of electronic devices was completed. Thereafter, through known post processing steps such as passivation, dicing, wire-bonding and molding, electronic devices were completed.

TABLE 1

| Commercially available TC-less resist | Type of repellent agent | Thickness of applied film (nm) | Pre-exposure bake (° C./sec.) | Post-exposure bake (° C./sec.) |
|---|---|---|---|---|
| Resist-A | Alkali soluble | 150 | 85/60 | 90/60 |
| Resist-B | Acid de-protection | 150 | 115/60 | 115/60 |

TABLE 1-continued

| Commercially available TC-less resist | Type of repellent agent | Thickness of applied film (nm) | Pre-exposure bake (° C./sec.) | Post-exposure bake (° C./sec.) |
|---|---|---|---|---|
| Resist-C | Alkali insoluble | 150 | 100/60 | 115/60 |

TABLE 2

| No. | Solvent name |
|---|---|
| Solvent 1 | $CF_3CH_2OCF_2CHF_2$ |
| Solvent 2 | m-xylene hexafluoride |
| Solvent 3 | n-butyl ether |
| Solvent 4 | isobutanol |
| Solvent 5 | diisopentylether |
| Solvent 6 | ethanol |
| Solvent 7 | isopropanol |

In Table 1, Resist-A is an ArF chemically-amplified resist having polymethacrylic acid as a base resin, having alkali-soluble surface segregation agent added. Resist-B is an ArF chemically-amplified resist having polymethacrylic acid as a base resin, having acid de-protection type surface segregation agent added. Resist-C is an ArF chemically-amplified resist having polymethacrylic acid as a base resin, having alkali-insoluble surface segregation agent added.

<Repellency (Contact Angle)>

Table 3 shows contact angles of top-coatless resist (FIG. 10(c)) obtained in Example 1 and the resist with water repellent agent at unexposed portions removed (FIG. 10(f)), with respect to pure water. No matter which solvent is used, top-coatless resists initially have large contact angle, and the angle decreases to sufficiently low angle after the process of removing water repellent agent. Similarly, contact angle with respect to 2.38% TMAH solution under various conditions are shown in Table 4. The contact angle was measured using a contact angle meter "CA-X" manufactured by Kyowa Interface Science Co. Ltd. About 2 μL of pure water was dropped on the surface of a test sample to attain contact, and stationary contact angle was calculated by θ/2 method.

TABLE 3

| | | Contact angle of resist film to pure water (°) | | |
|---|---|---|---|---|
| | | Resist-A | Resist-B | Resist-C |
| Before removal process | | 84 | 89 | 86 |
| After removal | Solvent 1 | 79 | 61 | 66 |
| | Solvent 2 | 78 | 70 | 69 |
| | Solvent 3 | 67 | 67 | 70 |
| | Solvent 4 | 62 | 64 | 65 |
| | Solvent 5 | 71 | 66 | 71 |
| | Solvent 6 | 59 | 64 | 64 |
| | Solvent 7 | 58 | 64 | 65 |

TABLE 4

| | | Contact angle of resist film to 2.38% TMAH solution (°) | | |
|---|---|---|---|---|
| | | Resist-A | Resist-B | Resist-C |
| Before removal process | | 76 | 91 | 85 |
| After removal | Solvent 1 | 75 | 65 | 64 |
| | Solvent 2 | 74 | 71 | 67 |
| | Solvent 3 | 66 | 68 | 67 |
| | Solvent 4 | 64 | 66 | 64 |
| | Solvent 5 | 70 | 66 | 71 |
| | Solvent 6 | 61 | 66 | 65 |
| | Solvent 7 | 60 | 66 | 64 |

From Tables 3 and 4, it can be seen that contact angle with respect to TMAH solution also decreased after dissolving and removing surface segregation agent, as in the case of pure water. By this process, various defects resulting from high repellency during the process step involving alkali developer (TMAH solution) and subsequent rinsing with pure water can be reduced.

It is noted that the dissolving and removing solution used in the dissolving and removing step is not limited to the combinations of solvents used in the present example, and a solvent optimal for the used top-coatless resist may be selected. Solvents may be mixed for use. As to the mixture ratio of solvents, the solvents may be freely mixed in a range that ensures sufficient mixing not causing phase separation of solvent mixtures. By way of example, Solvent 1 and Solvents 2 to 4 may be mixed at the ratio of 1:1 and can be used as solvent mixture, without phase separation. Considering performance of rinsing process and influence to apparatuses, a fluorine-based solvent having boiling point of 60 to 180° C., preferably having the boiling point of 100 to 150° C. should be used as the solvent.

Example 2

Figure 11:
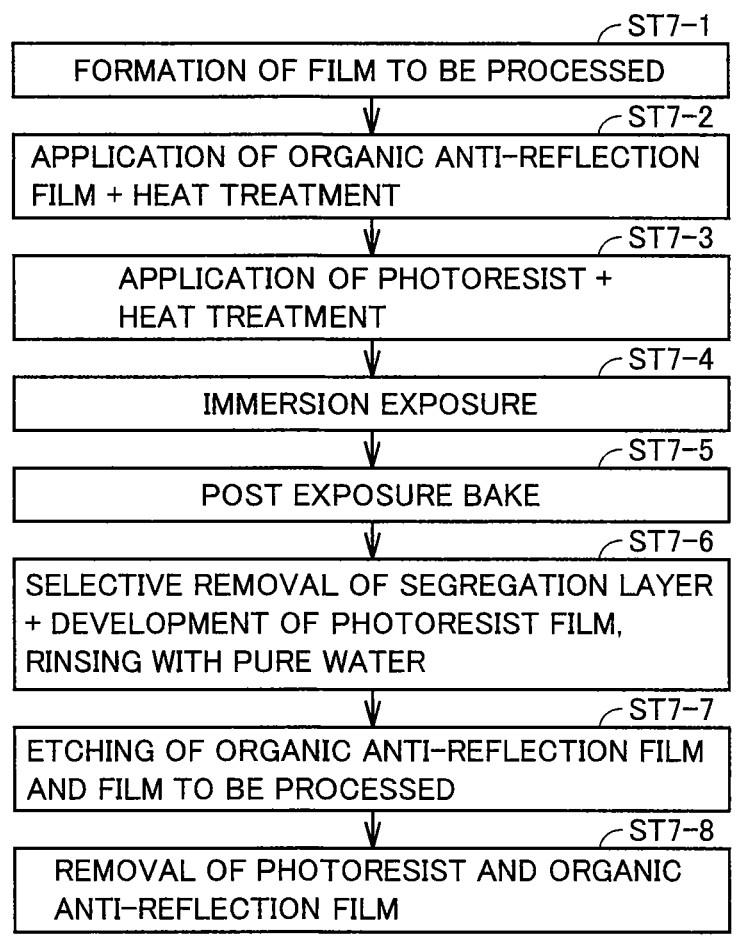
FIG. 11 is a process flow showing steps of manufacturing an electronic device, including the developing method for immersion lithography in accordance with Example 2.
Figure 12:
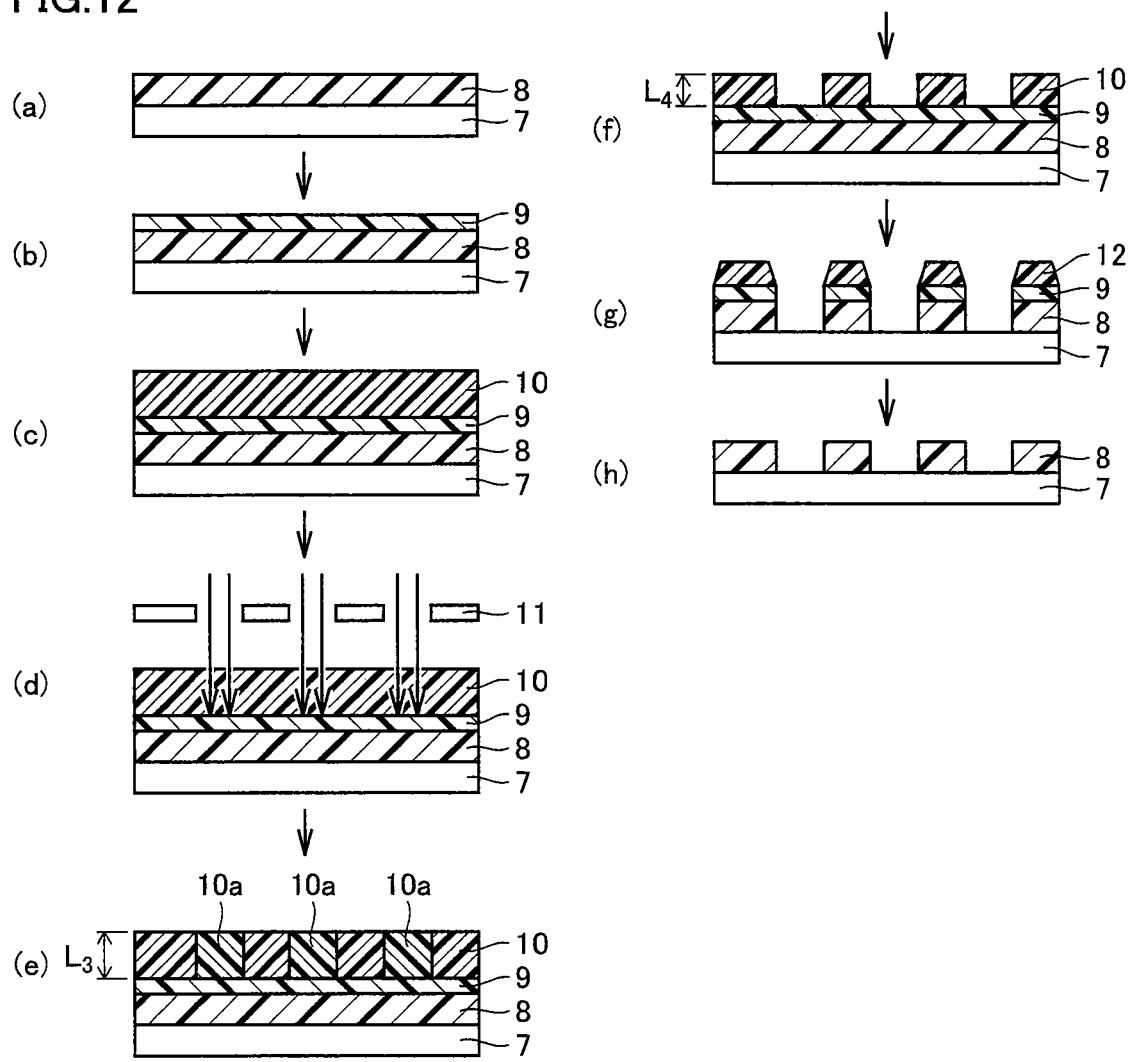
FIG. 12 includes schematic illustrations (*a*) to (*h*) representing various steps of manufacturing an electronic device, including the developing method for immersion lithography in accordance with Example 2.

FIG. 11 shows a process flow showing steps of manufacturing an electronic device, including the developing method for immersion lithography in accordance with Example 2. FIG. 12 includes schematic illustrations of respective steps. In Example 2, the dissolving and removing step was conducted simultaneously with the developing step of alkali immersion.

On a substrate 7 having a film 8 to be processed, an organic anti-reflection film 9 and photoresist film 10 were formed by the method used in Example 1. Substrate 7 was subjected to exposure process by immersion exposure through mask 11, and post exposure bake was conducted at 110° C. for 60 seconds (ST7-1 to ST7-5 of FIG. 11, FIGS. 12(a) to (e)).

Thereafter, using a top-coatless resist developer prepared by mixing 2.38% solution of tetramethyl ammonium hydroxide (TMAH), isobutanol and ethanol at the volume ratio of 2:1:1, the surface segregation agent existing at the surface layer portion of photoresist film 10 was selectively removed, and at the same time, photoresist film 10 was developed with alkali. Thereafter, rinsing process with pure water was conducted and pattern formation was completed (ST7-6 to ST7-8 of FIG. 11, FIGS. 12(f), (h)). The relation between $L_3$ and $L_4$ in FIGS. 12(e) and (f) is the same as that between $L_1$ and $L_2$.

Thereafter, using substrate 7 processed in the same manner as Example 1, through the wafer forming process for electronic devices, electronic devices were manufactured.

The mixture of alkali top-coatless resist developer used at the development step and the dissolving and removing solution at the dissolving and removing step is not limited to the combination of solvents described in the present example, and a solvent optimal for the used top-coatless resist may be selected. Solvents may be mixed for use. As to the mixture ratio of solvents serving as the dissolving and removing solvent and TMAH solution, the solvent or solvents and TMAH solution may be freely mixed in a range not causing phase separation of TMAH solution and each solvent.

Example 3

Figure 13:
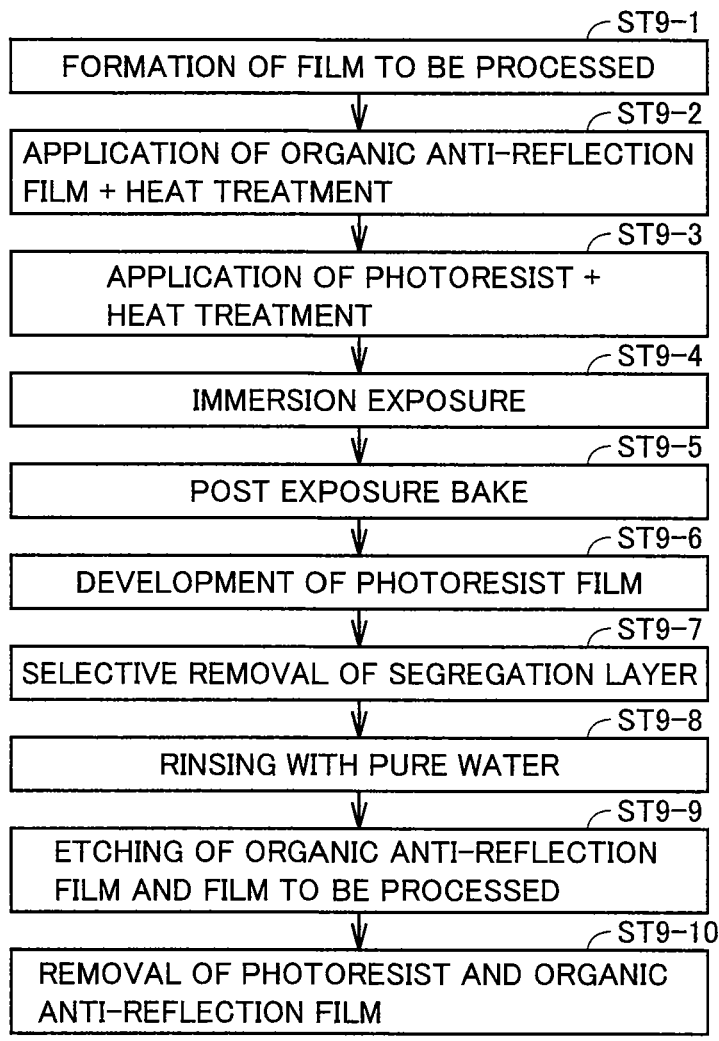
FIG. 13 is a process flow showing steps of manufacturing an electronic device, including the developing method for immersion lithography in accordance with Example 3.
Figure 14:
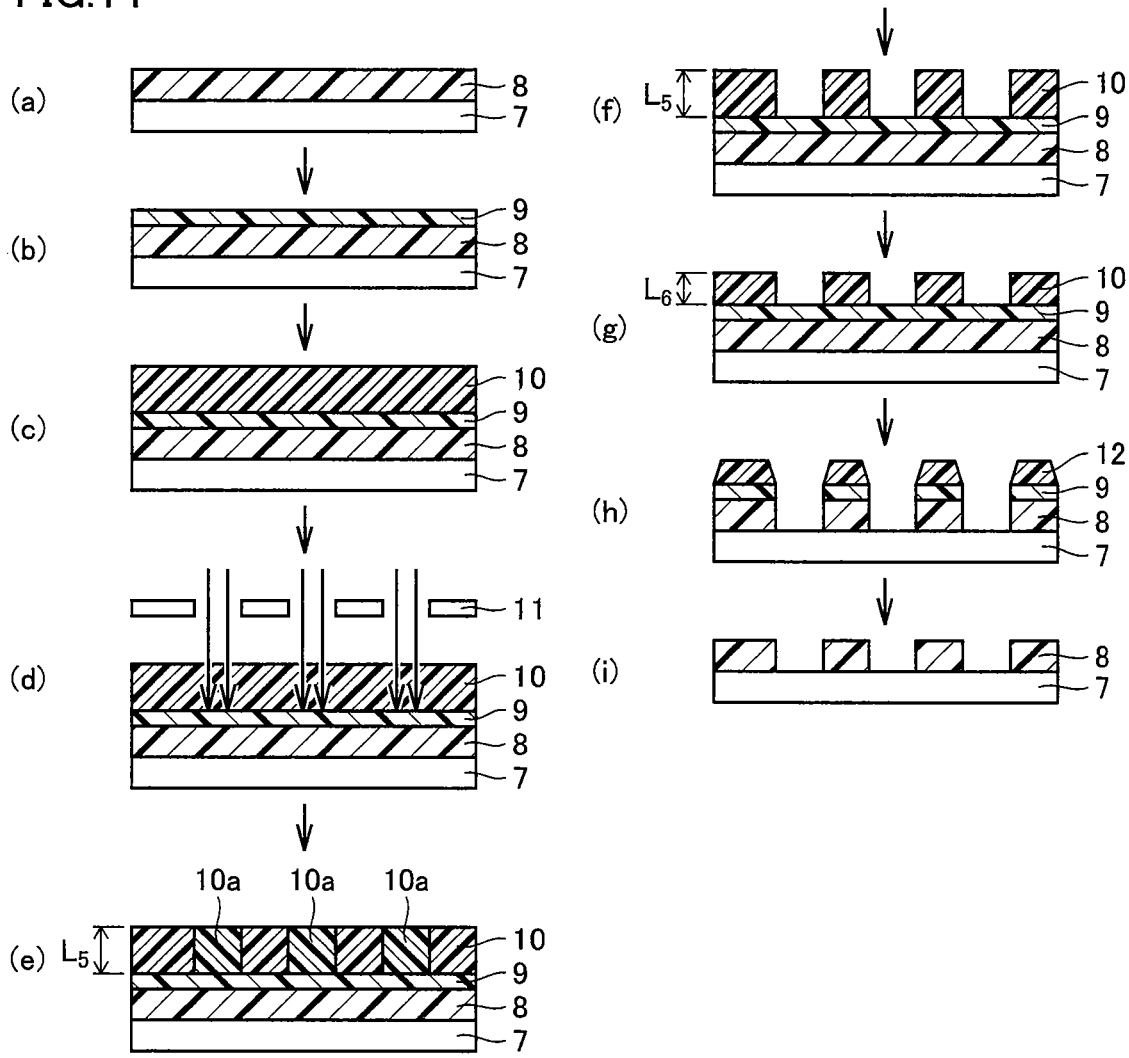
FIG. 14 includes schematic illustrations (*a*) to (*i*) representing various steps of manufacturing an electronic device, including the developing method for immersion lithography in accordance with Example 3.

FIG. 13 shows a process flow showing steps of manufacturing an electronic device, including the developing method for immersion lithography in accordance with Example 3. FIG. 14 includes schematic illustrations of respective steps.

example, and a solvent optimal for the used top-coatless resist may be selected. Solvents may be mixed for use. As to the mixture ratio of solvents, the solvents may be freely mixed in a range not causing phase separation of solvent mixtures. By way of example, Solvent 1 and Solvents 2 to 4 may be mixed at the ratio of 1:1 and can be used as solvent mixture, without phase separation.

Table 5 shows compatibility of the mixture of these solvents.

TABLE 5

| Solvent mixture No. | 2.38% TMAH solution | Solvent 1 | Solvent 2 | Solvent 3 | Solvent 4 | Solvent 5 | Solvent 6 | Solvent 7 | Compatibility |
|---|---|---|---|---|---|---|---|---|---|
| 1 | 1.0 | 1.0 | — | — | — | — | — | — | NG |
| 2 | 1.0 | — | 1.0 | — | — | — | — | — | NG |
| 3 | 1.0 | — | — | 1.0 | — | — | — | — | NG |
| 4 | 1.0 | — | — | — | 1.0 | — | — | — | NG |
| 5 | 1.0 | — | — | — | — | 1.0 | — | — | NG |
| 6 | 1.0 | — | — | — | — | — | 1.0 | — | OK |
| 7 | 1.0 | — | — | — | — | — | — | 1.0 | OK |
| 8 | 5.0 | — | — | — | — | — | — | 1.0 | OK |
| 9 | 1.0 | — | — | — | 1.0 | — | 1.0 | — | OK |
| 10 | 2.5 | — | — | — | 1.0 | — | 1.0 | — | OK |
| 11 | 3.0 | — | — | — | 1.0 | — | 1.0 | — | NG |
| 12 | 1.0 | — | — | — | — | 1.0 | 2.5 | — | NG |
| 13 | 1.0 | — | — | — | — | 1.0 | 3.0 | — | OK |
| 14 | 2.0 | 1.0 | — | — | 1.5 | — | 1.5 | — | NG |
| 15 | 2.0 | 1.0 | — | — | 2.0 | — | 2.5 | — | NG |
| 16 | 2.0 | 1.0 | — | — | 2.0 | — | 3.0 | — | OK |
| 17 | 1.0 | — | 1.0 | — | — | — | — | 1.0 | NG |
| 18 | 1.0 | — | 1.0 | — | — | — | 1.0 | 1.0 | NG |
| 19 | 1.0 | — | 1.0 | — | — | — | 1.5 | 1.0 | OK |
| 20 | 1.0 | — | 1.0 | — | — | — | 3.0 | — | NG |
| 21 | 1.0 | — | 1.0 | — | — | — | 3.0 | 1.0 | OK |
| 22 | 1.5 | — | 1.0 | — | — | — | 1.5 | 1.0 | NG |
| 23 | 1.5 | — | 1.0 | — | — | — | 2.0 | 1.0 | NG |
| 24 | 1.5 | — | 1.0 | — | — | — | 2.0 | 1.5 | OK |
| 25 | 2.0 | — | 1.0 | — | — | — | 2.0 | 1.5 | NG |
| 26 | 2.0 | — | 1.0 | — | — | — | 2.0 | 2.0 | OK |

In Example 3, the dissolving and removing step was conducted after the developing step by alkali immersion.

On a substrate 7 having a film 8 to be processed, an organic anti-reflection film 9 and photoresist film 10 were formed by the method used in Example 1. Substrate 7 was subjected to exposure process by immersion exposure through mask 11, and post exposure bake was conducted at 80 to 120° C. for 60 seconds (ST9-1 to ST9-5 of FIG. 13, FIGS. 14(a) to (e)).

Thereafter, development process was conducted using 2.38% solution of tetramethyl ammonium hydroxide (TMAH). Next, using Solvents 1 to 7 (dissolving and removing solutions) shown in Table 2, the surface segregation agents existing at the upper layer portion of photoresist film 10 were selectively removed, without dissolving chemically-amplified resist component as the main component of photoresist film, rinsing step with pure water (in the figure, rinsing) was conducted and pattern formation was completed (ST9-6 to ST9-10 of FIG. 13, FIGS. 14(f) to (i)). The relation between $L_5$ and $L_6$ in FIGS. 14(e) and (f) is the same as that between $L_1$ and $L_2$.

The solvent or solvents used at the dissolving and removing step are not limited to those mentioned in the present In Table 5, each mixture ratio is in volume ratio. In the compatibility box, "OK" means that phase separation was not observed when the mixture was left after shaking, while "NG" means that phase separation was observed immediately after the mixture was left after shaking.

Example 4

In Example 4, the dissolving and removing step is performed before the development step with alkali immersion, as in Example 1. The process flow is the same as that of Example 1 shown in FIG. 9, of which steps are schematically illustrated in FIG. 10.

On a substrate having a film to be processed formed thereon, a resist film was formed by the same method as used in Example 1. Resist films were formed using Resists A to C of Table 1, respectively. The substrate was exposed using an immersion exposure apparatus and subjected to post exposure bake. Thereafter, using solvent mixtures 27 to 29 containing pure water and ether-based solvent mixtures 30 to 32 shown in Table 6, the water repellent agents (surface segregation agents) existing at the upper layer portion of the photoresist film were selectively dissolved and removed, without dissolving chemically-amplified resist component as the main component of photoresist film. Thereafter, samples were rinsed using pure water if solvent mixtures containing pure water were used and with Solvent 3 if ether-based solvent mixtures were used. Next, development process was performed using 2.38% solution of tetramethyl ammonium hydroxide (TMAH). Then, samples were rinsed with pure water, and pattern formation was completed.

TABLE 6

| Solvent mixture No. | Solvent mixture ratio (volume ratio) |
|---|---|
| 27 | Solvent 7/Pure water = 20/80 |
| 28 | Solvent 7/Pure water = 40/60 |
| 29 | Solvent 7/Pure water = 60/40 |
| 30 | Solvent 7/Solvent 3 = 20/80 |
| 31 | Solvent 7/Solvent 3 = 40/60 |
| 32 | Solvent 7/Solvent 3 = 60/40 |

Contact angles of top-coatless resist (ST5-3 of FIG. 9) obtained in the present example and the resist with water repellent agent (surface segregation agent) at unexposed portions removed (ST5-6 of FIG. 9) with respect to pure water were measured in accordance with the method described above. Results are as shown in Tables 7 and 8. No matter which solvent is used, top-coatless resists initially have large contact angle, and the angle decreases to sufficiently low angle after the process of removing water repellent agent (surface segregation agent).

The dissolving and removing solutions containing surface segregation agent after the step ST5-6 of the process flow shown in FIG. 9 were analyzed for samples treated with water-based solvent and ether-based solvent as the dissolving and removing solutions. As a result, components believed to be base resin of resist or acid generating agent contained in the resist were detected. Further, decrease in repellency (contact angle) at the resist surface was confirmed, and resist pattern defects were reduced. Therefore, as long as the effects of the invention can be attained, the photo-acid generating agent contained in the resist film or base resin forming the resist may be slightly removed by the dissolving and removing solution at the step of dissolving and removing the surface segregation agent, within the scope of the invention.

Table 9 shows compatibility of 2.38% solution of TMAH and solvent mixtures 27 to 32. Water-based solvents tend to be highly compatible with TMAH at an arbitrary ratio and, therefore, phase separation of waste liquid can be prevented. It can be seen that ether-based solvents tend to result in waste liquid separation and, accordingly, appropriate waste treatment becomes necessary.

TABLE 7

| | | Contact angle of resist film to pure water (°) | |
|---|---|---|---|
| | | Resist-A | Resist-B | Resist-C |
| Before removal process | | 85 | 90 | 88 |
| After removal | 27 | 78 | 89 | 79 |
| | 28 | 72 | 84 | 73 |
| | 29 | 56 | 77 | 67 |

TABLE 8

| | | Contact angle of resist film to pure water (°) | |
|---|---|---|---|
| | | Resist-A | Resist-B | Resist-C |
| Before removal process | | 85 | 90 | 88 |
| After removal | 30 | 62 | 64 | 67 |
| | 31 | 63 | 63 | 65 |
| | 32 | 65 | 63 | 64 |

TABLE 9

| | Solubility to TMAH 2.38% solution | |
|---|---|---|
| | TMAH/solvent = 1/20 | TMAH/solvent = 20/1 |
| 27 | compatible | compatible |
| 28 | compatible | compatible |
| 29 | compatible | compatible |
| 30 | phase separated | phase separated |
| 31 | phase separated | phase separated |
| 32 | compatible | phase separated |

Example 5

In accordance with the same process flow as Example 2, on a substrate having a film to be processed formed thereon, a resist film was formed by the same method as used in Example 2. Resist films were formed using Resists A to C of Table 1, respectively. The substrate was exposed using an immersion exposure apparatus and subjected to post exposure bake at 110° C. for 60 seconds. Thereafter, using the top-coatless resist developers shown in Table 10, alkali development process and pure water rinsing process of the photoresist were conducted simultaneously while the surface segregation layer of water repellent agent existing at the surface layer portion of photoresist was selectively removed, and pattern formation was completed.

TABLE 10

| Developer | Composition of top-coatless resist developer (volume ratio) |
|---|---|
| No. 1 | Solvent 7/pure water/TMAH = 30/20/50 |
| No. 2 | Solvent 7/Solvent 3/TMAH = 16/64/4 |

Both developers shown in Table 10 resulted in satisfactory pattern formation. Further, according to the developing method of the present invention, by selecting the dissolving and removing solution for selectively dissolving the surface segregation layer and by selecting development step, pattern formation with high throughput becomes possible and the process steps of waste treatment, for example, can be simplified. Therefore, the invention provides a highly efficient method of forming electronic devices.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A developing method for immersion lithography of an electronic device with a resist containing a surface segregation agent, which is expressed by a general expression (1), and chemically-amplified resist component, comprising:

a step of development with alkali immersion, wherein the surface segregation agent is insoluble in the developer, and a step of dissolving and removing, conducted using a dissolving and removing solution that selectively dissolves and removes said surface segregation agent of an upper layer portion of said resist without dissolving said chemically-amplified resist component, said general expression (1) being:

where R represents a hydrogen atom, lower alkyl group, halogen atom, or lower alkyl halide group, $Y^0$ represents an alkylene group, and $R^f$ represents a fluorinated alkyl group, wherein said dissolving and removing solution comprises a mixture of at least one alcohol and at least one ether.

2. The developing method for immersion lithography according to claim 1, wherein
said step of dissolving and removing is performed before said step of development, and conducted through rinsing or immersion.

3. The developing method for immersion lithography according to claim 1, wherein
said step of dissolving and removing is performed simultaneously with said step of development.

4. The developing method for immersion lithography according to claim 1, wherein
said step of dissolving and removing is performed after said step of development.

5. The developing method for immersion lithography according to claim 1, wherein
said step of development and said step of dissolving and removing are performed using a same cup.

6. The developing method for immersion lithography according to claim 1, wherein
said at least one alcohol has a carbon number of 4 or larger and said at least one ether is an alkyl ether having a carbon number of 5 or larger.

7. The developing method for immersion lithography according to claim 1, wherein
said dissolving and removing solution at said step of dissolving and removing contains a fluorine-containing solvent.

8. The developing method for immersion lithography according to claim 1, wherein
said dissolving and removing solution at said step of dissolving and removing contains water.

* * * * *